United States Patent [19]
Hrovat et al.

[11] Patent Number: 5,365,172
[45] Date of Patent: Nov. 15, 1994

[54] METHODS AND APPARATUS FOR MRI

[75] Inventors: Mirko I. Hrovat, Brockton; Samuel Patz, Brookline; Yuly M. Pulyer, Malden, all of Mass.

[73] Assignee: Brigham and Women's Hospital, Boston, Mass.

[21] Appl. No.: 927,173

[22] Filed: Aug. 7, 1992

[51] Int. Cl.$^5$ ............................................ G01R 33/20
[52] U.S. Cl. .................................................. 324/309
[58] Field of Search ............... 324/300, 307, 309, 318, 324/319, 320, 322

[56]        References Cited
       U.S. PATENT DOCUMENTS 3,932,805  1/1976  Abe et al. .............................. 324/309
4,015,196  3/1977  Moore et al. ......................... 324/309
4,021,726  5/1977  Garroway et al. ................... 324/309
4,468,622  8/1984  Frese et al. .......................... 324/319
4,486,711  12/1984 Frese et al. .......................... 324/319
4,626,784  12/1986 Sepponen .............................. 324/309

Primary Examiner—Michael J. Tokar
Attorney, Agent, or Firm—George W. Neuner

[57]               ABSTRACT

Apparatus and methods for performing MRI are disclosed wherein the encoding field has a multidimensional, preferably periodic, dependence. Two dimensional image information can be obtained without the necessity for switching the encoding field. Further, velocity information can be obtained. Preferred coil structures for providing preferred encoding fields are described.

26 Claims, 8 Drawing Sheets

METHODS AND APPARATUS FOR MRI

FIELD OF THE INVENTION

This invention relates to methods and apparatus for nuclear magnetic resonance (NMR) imaging also known as magnetic resonance imaging (MRI). More specifically, this invention relates to MRI apparatus for providing non-linear encoding magnetic fields having a multidimensional component in the imaging volume and to MRI methods for obtaining image formation information from an object by subjecting the object to encoding magnetic fields having a multidimensional component.

BACKGROUND OF THE INVENTION

MRI is a relatively recent diagnostic imaging modality. In addition to providing contrast resolution and spatial resolution, MRI offers tissue information and data about metabolic processes in the body. MRI provides multiple parameters for obtaining image information, some of which carry a great deal of information, and some of which can be manipulated to obtain a tissue diagnostic image. These parameters are: (1) pro,on density, (2) tissue relaxation parameters T1 (spin lattice) and T2 (spin-spin) and (3) motion, which provides information about blood flow.

Thus, MRI has been developed as an imaging modality used to obtain images of anatomical features of human patients as well as some aspects of the functional activity of biological tissue. The images have medical diagnostic value in determining the state of health of the tissue examined. To obtain images, typically, the patient is aligned to place the portion of the anatomy to be examined in the imaging volume of a MRI apparatus. The apparatus typically comprises a primary magnet for supplying a constant magnetic field ($B_o$) which by convention is along the z-axis and is substantially homogeneous over the imaging volume and secondary magnets that can provide linear magnetic field gradients along each of three principal Cartesian axes in space (generally x, y, and z, or $x_1$, $x_2$ and $x_3$, respectively). A magnetic field gradient ($\delta B_z/\delta x_i$) refers to the variation of the field along the direction parallel to $B_o$ with respect to each of the three principal Cartesian axes, $x_i$. The apparatus also comprises one or more RF (radiofrequency) coils which provide excitation and detection of the NMR signal.

A number of methods have been proposed and used to spatially encode the NMR signal in order to perform MRI. These techniques can be classified as follows.

1. Fourier Encoding. Perhaps the most basic of methods to obtain one dimensional spatial information is to apply a magnetic field gradient to excited nuclear spins. The Larmor precession frequency is then linearly related to position in the gradient. The observed signal, when Fourier transformed, gives a projection of the object in the direction of the gradient.

An extension of this method to more than one dimension is often referred to as the SPIN WARP METHOD. Different lines of k-space (i.e. The multidimensional Fourier transform of image space) are acquired on different excitations of the nuclei. K-space is a multidimensional space in which The data is acquired. For example, consider the two dimensional case, say $k_x$ and $K_y$. $K_x$ is defined as the phase per unit position in x and $k_y$ is the phase per unit position in y. During each excitation, a linear readout gradient is always applied during data acquisition to spatially discriminate the NMR signal along its direction (say x) and Thus acquire different $k_x$ data. In subsequent excitations an incremental phase shift in the orthogonal direction y is applied prior To the data acquisition in order to change the value of $k_y$ for the next $k_x$ line. A two dimensional Fourier transfer (2DFT) is performed on the data to give the resultant image. See, Edelstein, W. A., Hutchison, J. M. S., Johnson, G., Redpath, T. W., *Phys. Med. Biol*, 25:751, 1980, which is hereby incorporated by reference.

2. Field Profiling Techniques. These methods create a small region where the field is homogeneous, "sweet spot", with the field rapidly decreasing at the edges such that the NMR signal within a limited bandwidth (i.e. limited frequency range) is limited to the small homogeneous region. This technique is also known as topical magnetic resonance TMR. To image the object, it is moved so that different regions of the object are located in the "sweet spot" and hence imaged in a sequential way. See, for example, U.S. Pat. No. 3,932,805, which is hereby incorporated by reference.

3. Sensitive Point Techniques. These techniques create a "sweet spot" by oscillating the magnetic field gradients as a function of time. In the sensitive point method, all three gradients are modulated such that there is one point where the field from each gradient is zero and does not change as a function of time. The NMR signal, when averaged as a function of time, is finite only in a small region surrounding this point. This sensitive point is then electronically moved to different regions of the object to be imaged in order to obtain the NMR signal from different spatial regions. See, for example, U.S. Pat. No. 4,015,192, which is hereby incorporated by reference.

4. Sensitive Line Techniques. This method is similar to the sensitive point technique except that only two gradients are modulated such that a "null line" is defined. The signal obtained is from a small cylindrical region whose axis is defined by this null line. The line is then scanned across the plane to be imaged. Spatial information along the line is resolved by having a constant linear magnetic field gradient applied in the direction of the line such that the NMR Larmor precession frequency depends linearly on position along the line. Hence, simple Fourier transformation of the NMR signal resolves position along the line.

5. Selective Techniques Which Use Magnetic Field Gradients. These include sequential application of orthogonal linear gradients and bandwidth limited excitation pulses to first excite a plane, then a line in the plane, and "reading out" the NMR signal in the presence of a third orthogonal linear gradient. The observed NMR signal is Fourier transformed to obtain spatial information along the final selected "line". See, for example, U.S. Pat. No. 4,021,726, which is hereby incorporated by reference.

6. Rotating Frame Zeugmatography. In this method, a radio frequency field which has a spatial gradient is applied to the object to be imaged. By varying the amount of amplitude or duration of RF energy applied to the coil, material in the object being imaged is excited by varying amounts. As the amount of energy applied to the RF gradient coil increases, the magnetization components at a given point in the object undergo a sinusoidal variation. The larger the RF field is in the object, the faster the sinusoidal variation. Hence, the signal, which is proportional to the transverse magnetization, is "phase encoded". A Fourier transform of multiply obtained sets of data (i.e. each with a different amplitude of excitation of The RF coil) provides spatial discrimination along The gradient of the RF field. (See, D. I. Hoult, *Journal of Magnetic Resonance*, 33, 183–197 (1979))which is hereby incorporated by reference.

Imaging data for construction of MRI images can be collected using one of many available techniques such as, for example, those described above. Typically, such techniques use a pulse sequence which generates a plurality of sequentially implemented views. Each view comprises a field gradient pulse to encode spatial information into the NMR signal which is collected during that view. Each view may be prepared by RF excitation pulses and/or field gradient pulses prior to the collection of that view. All currently known MRI imaging techniques employ views which by themselves are one dimensional. Therefore, to obtain multidimensional information, requires the acquisition of many views. To go from one view to another in conventional techniques requires modulation of the magnetic field gradient pulses between views. The NMR signal may be a free induction decay (FID) or a spin echo signal (SE). In most of the currently adopted techniques for MRI, the signal is received in the form of a spin echo. The encoding field gradient which is present during the detection of the SE is denoted as the view or readout gradient. Two or more dimensional images are obtained by acquiring multiple views with each view spatially encoded in a different manner. Well known techniques are then applied to the multiple views in order to reconstruct an image of the tissue. The fastest MRI method available today is known as "Echo Planar Imaging" (EPI). EPI is capable of providing the data for a single planar image in approximately 100 milliseconds (ms). Multiple planar images can be collected and later combined to provide a three dimensional image. In another implementation, an additional phase encoding linear field gradient may be added to provide spatial encoding along a third spatial direction. The image is then reconstructed using three dimensional Fourier transform (3DFT) methods to provide a 3D image.

EPI is fast because it acquires all of the different phase encoded views required for a 2D image in one excitation of the nuclei. To achieve this, EPI methods require that the encoding field gradients be switched very. quickly, on the order of hundreds of microseconds (μs). The speed of EPI is also dependent on the strength of the encoding fields, and further decreases in imaging time can be accomplished by using larger field gradients. The switching of large field gradients requires expensive and sophisticated amplifier technology. In addition, transitory fields induce eddy currents in the surrounding metallic structures as well as in the patient, which causes image distortion. Typically, manufacturers minimize the eddy currents in the surrounding metallic structures by employing what is known as actively shielded gradients. An actively shielded gradient coil see is carefully designed to minimize the magnetic flux extending beyond the gradient coil structure into the surrounding metallic structures of the magnet. Consequently, eddy currents are substantially reduced which allows the implementation of EPI methods. Eddy currents induced in the patient cannot be minimized except by limits imposed on the switching times of the gradient fields. Hence, the speed of EPI techniques is then limited by the time the technology permits in switching the readout and phase encoding gradients to go from one view to another.

Rapid imaging techniques have found clinical use in imaging rapidly moving structures such as The heart, in following bolus injections of contrast agents (for example to measure tissue perfusion) as well as decreasing the patient examination time. New imaging techniques are desirable for further advances in MRI.

SUMMARY OF THE INVENTION

The present invention provides new apparatus and methods for collecting NMR signals from a subject. Preferred embodiments enable collecting signals from a planar section of a subject without switching of the encoding field during the acquisition of two-dimensional image information and, hence, an entire two-dimensional image set is acquired in a single view, thereby reducing a limitation to the speed at which images can be acquired.

In accord with the invention. an apparatus is provided that is useful for obtaining MIll image formation information from a subject or object placed in an imaging space or volume. The apparatus comprises a primary magnet system for providing a substantially homogeneous magnetic field $B_o$ over the imaging volume, an excitation system for applying RF excitation to the subject in the imaging volume, a receiving system for capturing of NMR signals, and an encoding field system for providing a spatially varying magnetic field to the subject in the imaging volume to provide spatial discrimination of the NMR signals in at least to orthogonal directions, wherein the encoding field comprises a multidimensional dependence. The encoding field is preferably a function of to orthogonal spatial variables and, more preferably, a periodic function of one of the orthogonal spatial variables. Most preferably, the encoding field also has a substantially linear dependence orthogonal to the periodic function. Conveniently, the excitation system and receiving system can use the same RF coil.

Also, in accord with the invention. a method for obtaining MRI image formation information is provided. The method comprises positioning a subject in an imaging space or volume, providing a substantially homogeneous magnetic field $B_o$ to the subject in the imaging volume; applying in a controlled time sequence a radio frequency field and an encoding magnetic field to spatially encode NMR signals; detecting the spatially encoded NMR signals; and reconstructing an image of at least a portion of the object in the imaging space based on the information in the spatially encoded NMR signals; wherein the method further comprises providing a encoding magnetic field comprising a field component that has a multidimensional dependence.

In accord with a preferred embodiment of the invention, an MRI method is provided for obtaining two dimensional information from a subject in one signal acquisition interval or view. A preferred method comprises providing a magnetic encoding field having (1) a substantially linear gradient first field and (2) a multidimensional second field that has a periodic dependence in the direction parallel to the linear gradient first field, thereby spatially encoding the NMR signal in two dimensions. The two fields may or may not be simultaneous in time. Thus, two dimensional information is collected in one signal acquisition or view.

In another embodiment of the invention, a method is provided for obtaining velocity information from a subject. The method comprises providing a magnetic encoding field having a periodic field, thereby modulating the frequency nuclei moving in the direction of spatial periodicity. Simple FM (frequency modulation) detection of the NMR signal provides a velocity distribution of the moving nuclei.

Preferably, MRI apparatus in accord with this invention comprises a polypole coil for providing a multidimensional dependent magnetic encoding field. A polypole coil comprises a plurality of pairs of electrical current carriers aligned in a first spatial direction wherein the current flow in the carriers is orthogonal to the first spatial direction and wherein the carriers are arranged such that the first carrier of each pair has electrical current flowing in one direction and the second carrier in each pair has electrical current flowing in the opposite direction, wherein a periodic magnetic field is provided.

One preferred embodiment of a polypole coil comprises a plurality of electrical current carriers, each carrier encircling at least a portion of the circumference of a cylindrically shaped volume, each carrier substantially in a plane perpendicular to the longitudinal axis of the cylinder, the carriers equally spaced from each other along the axis, preferably substantially equally spaced, and the carriers together extending along the axis a predetermined distance in accord with the axial dimension of the imaging volume. One set of carriers have electrical current flow in one direction (say clockwise) around the cylinder and the other carriers (interlaced with the first set of carriers) have electrical current flow in the opposite direction (counterclockwise) around the cylinder to provide an alternating and periodic field along one direction (e.g., the z axis).

In another preferred embodiment, a polypole coil provides an encoding magnetic field having a periodic dependence along one direction and having the amplitude of the periodic component varying substantially linearly along a direction orthogonal to the direction of the periodicity. A coil structure comprises a first plurality of electrical current carriers arranged arcuately on one-half of the circumference of a cylindrically shaped volume, each carrier in a plane perpendicular to the longitudinal axis of the cylinder, one set of carriers having electrical current flow in one direction (say clockwise) around the cylinder and the other carriers (interlaced with the first set) having current flow in the opposite direction (counterclockwise). On the other half of the circumference of the cylinder is arranged a second plurality of electrical current carriers symmetrical with the first plurality of carriers, the carriers in the second plurality being arranged such that the current flow in the carrier in the second plurality flows in a direction around the cylinder toward the current in the carrier in the same plane on the opposite half of the cylinder, i.e. clockwise in one half and counterclockwise in the other half.

In a further preferred embodiment of the invention, an encoding magnetic field is provided by a polypole coil system having parallel electrical current carriers arranged in a plane so that a linear dependence amplitude component is provided perpendicular to the plane and a periodic field component is provided in the direction parallel to the plane and perpendicular to lengths of current carriers arranged in the Diane. The electrical current carriers are arranged in the plane parallel to each other and spaced from each other, preferably equally spaced, such that the length of the carrier is substantially greater than the distance between carriers. One set of carriers have electrical current flow in one direction and the other parallel carriers (interfaced with the first set) have current flow in the opposite direction.

For purposes of the present invention, a plurality of conductors may be stacked, i.e. superimposed in the same relative position, spaced from other stacks of carriers, and the stacks of carriers will be considered to be in the plane for purposes of describing the encoding magnetic field components. Also, for purposes of this invention the term "substantially homogeneous" refers to a primary magnetic field that can be used to provide an imaging space for useful diagnostic MRI.

DETAILED DESCRIPTION OF THE INVENTION AND THE PREFERRED EMBODIMENTS

Figure 1:
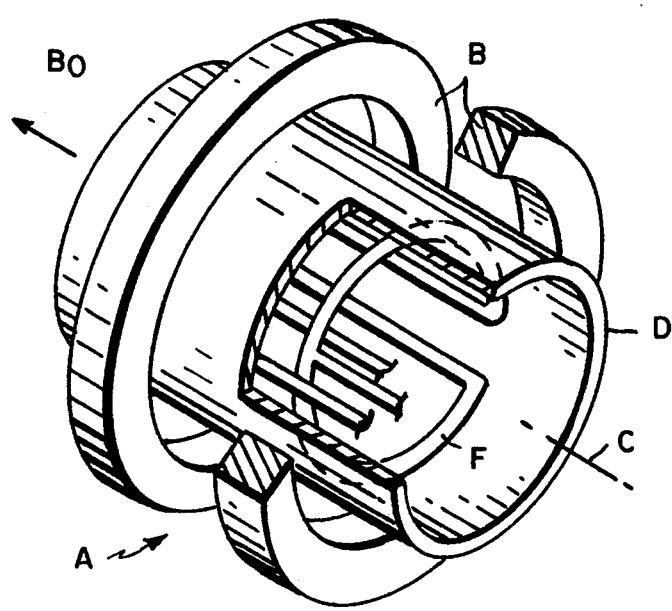
FIG. 1 is a prospective drawing of conventional apparatus for MRI illustrating principle components.
Figure 2:
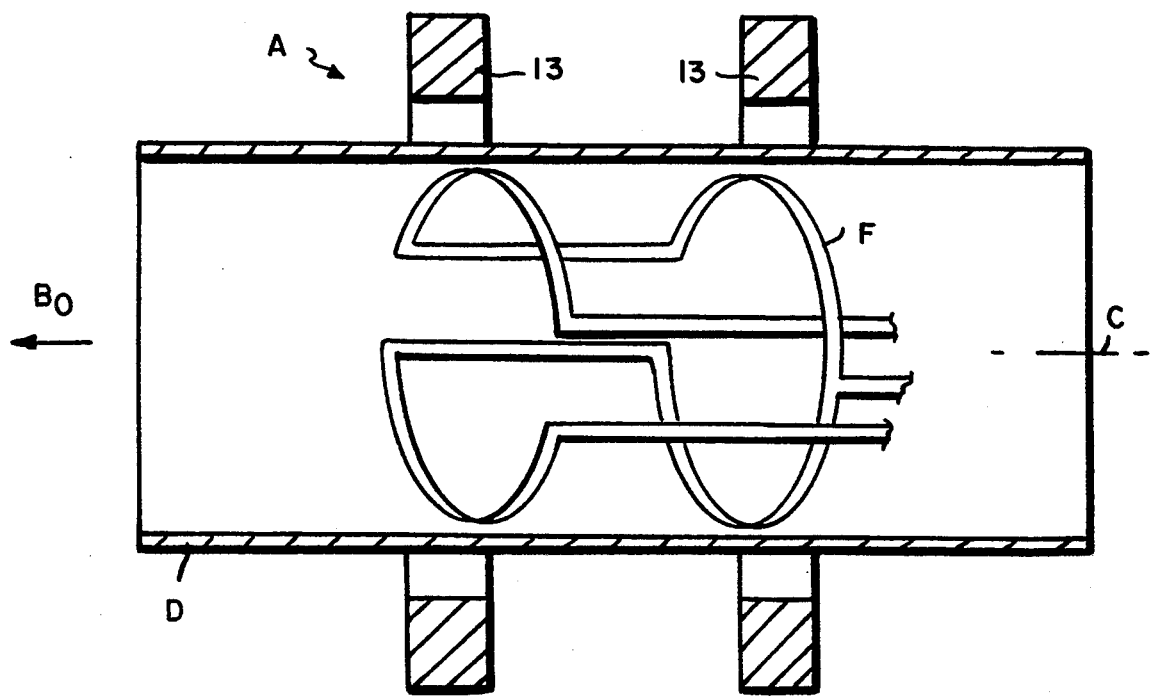
FIG. 2 is a cross-sectional elevation view of a conventional MRI apparatus.

With reference now to The drawings, there is shown in FIG. 1a perspective view of the major components of a conventional MRI system that may be used for generating nuclear magnetic resonance in materials, typically patients, placed in the system for examination. The MRI system, generally designated by the letter A, does not illustrate the electronic and computer subsystems normally required for use in MRI applications, but does show generally The environment in which the improved apparatus and methods of the invention are used. The system of FIG. 1 includes a Helmholtz coil pair B used to generate a large, static, substantially homogeneous magnetic field in the imaging space or volume in a direction parallel To the z-axis or line C. Within a cylinder D, an object or subject may be placed for examination using the NMR phenomenon. The subject is placed on the z-axis or line C and is located, within a saddle-shaped coil F. The saddle-shaped coil F is representative of typical prior art devices used to generate an RF field in the subject placed in the system for examination. The RF field, when in the presence of a static magnetic field $B_o$ causes the occurrence of magnetic resonance in nuclei of certain elements, such as hydrogen, in the specimen to be examined.

The direction of the static magnetic field $B_o$ produced by the coil pair B is indicated by an arrow. Currents are made to flow in the RF coil F. The direction of the currents reverse each half-cycle of the alternating RF current in coil F. This produces a transverse magnetic field of low magnitude compared to $B_o$. The magnitude of the flux density resulting from the static magnetic-field intensity $B_o$ may be typically on the order of a Tesla.

The static magnetic field $B_o$ is constant while the subject is in the system for analysis or examination. The RF transverse magnetic field is applied for a time sufficient only to allow the protons in the hydrogen atoms (or the nuclei of other atoms exhibiting the magnetic resonance phenomenon) to be affected such that precession of the net magnetization of the subject occurs. The precession of the net magnetic field associated with the nuclei in the subject occurs at the Larmor frequency, which is directly proportional to the magnitude of the magnetic field at the location of the nuclei. This can be detected as an NMR signal which provides the information for reconstruction of an image.

In MRI systems, it is necessary to provide various coils (not show in FIG. 1) for producing spatially encoding gradients that are imposed upon the static magnetic field within the region in which the subject to be examined is placed. The gradient-coil apparatus is typically positioned on the outside of a cylindrical surface, such as the surface D, which may be used as a support structure for the gradient coils. The gradient coils conventionally produce linear magnetic field gradients in any of the three orthogonal directions x, y and z. Conventionally, the direction of the line C is designated as the z-direction or z-axis and the x and y axes of the coordinate system are orthogonal to the z-axis and to one another.

The typical configuration of a z-gradient coil is illustrated in U.S. Pat. No. 4,468,622, which is hereby incorporated by reference. The configuration of the typical transverse (x or y) gradient coils is illustrated in U.S. Pat. No. 4,486,711, which is hereby incorporated by reference.

Figure 3:
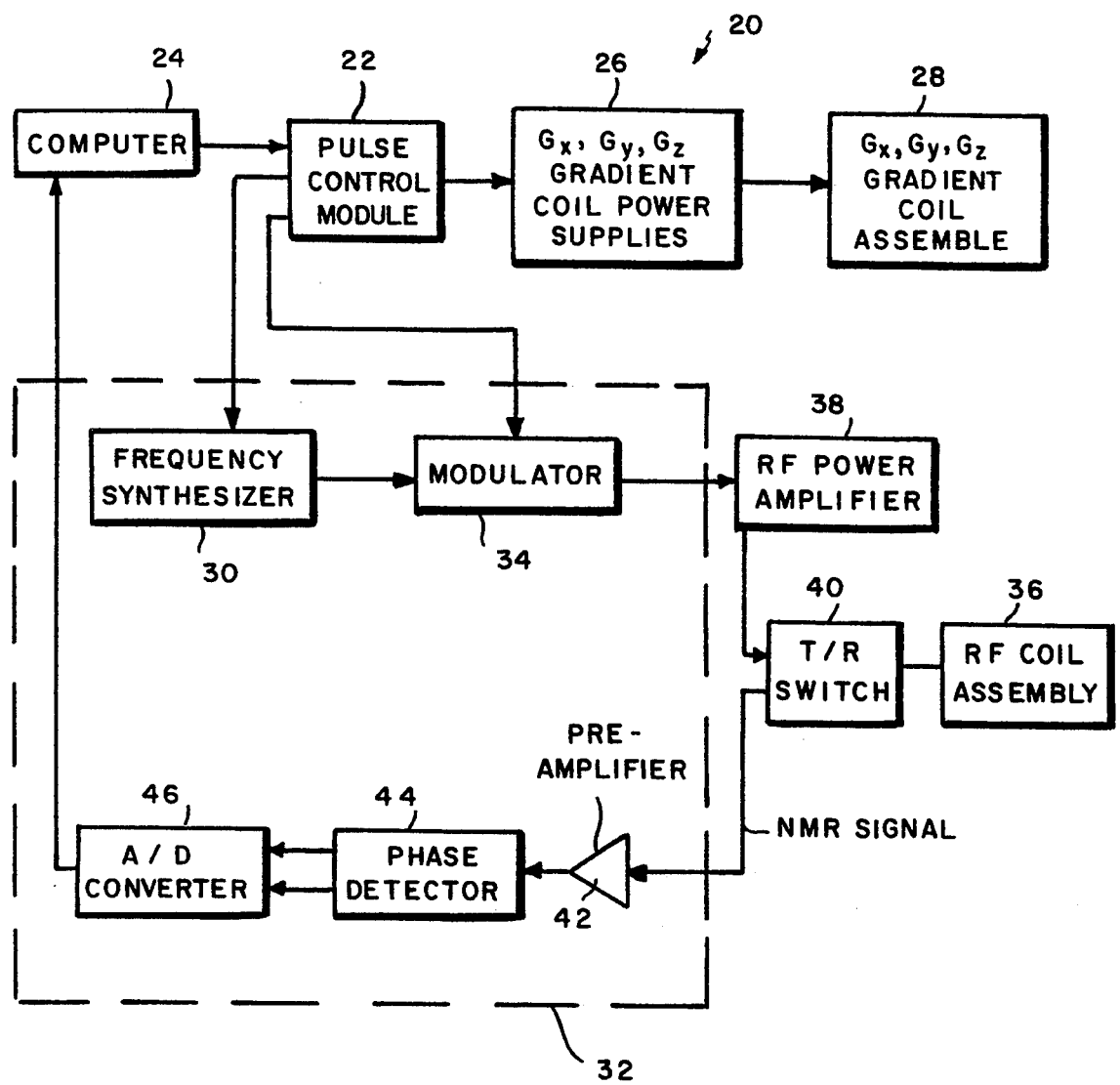
FIG. 3 illustrates a block schematic of a typical MRI system useful for practicing the invention.

FIG. 3 is a simplified block diagram of a conventional MRI system with respect to which the preferred embodiments of the invention will be disclosed. It will be recognized, however, that the invention as claimed may be advantageously practiced with any suitable MRI apparatus. the system, generally designated 20, includes a pulse control module 22 which provides properly timed pulse waveform signals, under the control of a host computer 24, to magnetic field gradient power supplies collectively designated 26 which energize gradient coils forming part of a gradient coil assembly generally indicated by a block 28. the assembly contains coils which, when energized by the power supplied, produce the $G_x$, $G_y$, and $G_z$ magnetic field gradients directed in the x, y, and z directions, respectively, of the Cartesian coordinate system.

The pulse control module provides activating pulses to an RF synthesizer 30 which is part of an RF transceiver system, portions of which are enclosed by dash-line block 32. the pulse control module also supplies modulating signals to a modulator 34 which modulates the output of the RF frequency synthesizer. The modulated RF signals are applied to an RF coil assembly 36 through an RF power amplifier 38 and a transmit/receive switch 40. the RF signals are used to excite nuclear spins in the subject undergoing examination.

The NMR signals from the excited nuclear spins are picked up by the RF coil assembly and applied through the transmit/receive switch to an RF preamplifier 42 and then to a quadrature phase detector 44. The detected signals are digitized by A/D converter 46 and supplied to a computer 24 for processing in a well-known manner to, for example, reconstruct images of the sample.

The invention will now be further explained by describing an imaging technique for signal acquisition interval with a preferred embodiment of the invention.

Figure 9:
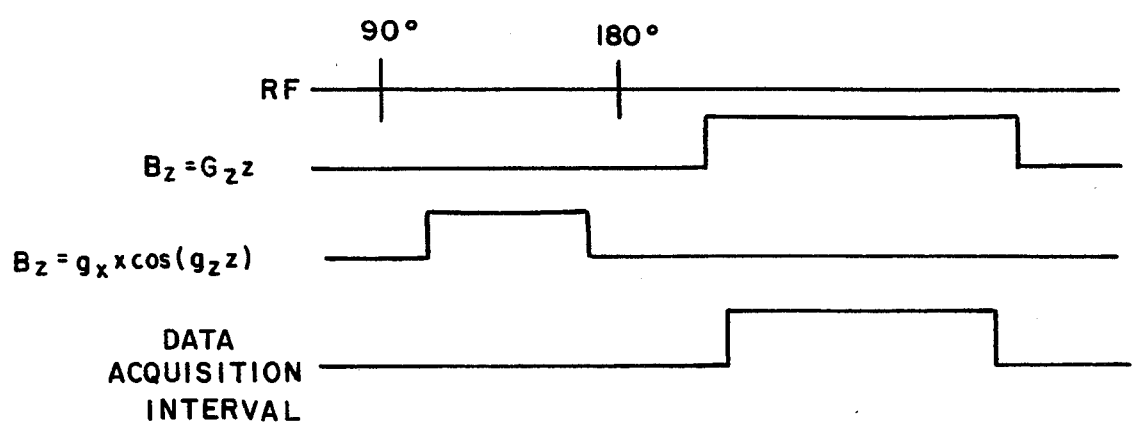
FIG. 9 is a schematic of a pulse sequence useful in accord with a preferred embodiment for MRI.

For example, in accord with a preferred embodiment, a pulse sequence such as schematically illustrated in FIG. 9 is used to spatially encode and read the nuclear spins (NMR signals) from a subject. the RF channel has a 90° excitation pulse and a 180° refocusing pulse. Two dimensional data is collected in xz plane. If slice selection in the y coordinate is desired, either the 90° or 180° or both pulses can be made slice selective and a y gradient applied during the time of these RF pulses in order to select a slice. This is a standard way to perform slice selection in MRI. During the time between the 90 and 180 pulse, the polypole field given by $$B = G_x \, x \cos(g_z z). \tag{1}$$

creates a phase shift in the signal:

$$\Phi = \gamma G_x x T \cos(g_z z) \tag{2}$$

where $g_z$ is $2\pi$ divided by the spatial wavelength of the periodic component of $B_z$, $G_x x$ is the amplitude of the periodic field, and the field is turned on for a duration T. The readout gradient, turned on after the 180° pulse and during signal acquisition, has a conventional linear field dependence given by $$B_z(z) = G_z z \tag{3}$$

Note that the current to the field encoding coils is switched on and off but not during the signal acquisition of the entire 2D data set. This makes this technique faster than EPI which requires the field encoding coil to be switched between the acquisition of different lines of k-space data.

The 180° pulse inverts the sign of $\Phi$. After the 180° pulse, the linear gradient $G_z$ is applied. Denoting the time t=0 as the point at which $G_z$ is turned on, the total accumulated phase (including the contribution from Eqn 2 is $$\Phi(t) = -\gamma G_x T \cos(g_z z) = \gamma G_z z t \qquad (4)$$

the signal S (t) is then given by:

$$S(t) = \int \int \rho(x,z) \exp\{i\gamma(G_z z t - G_x T \cos(g_z z))\} dx dz \qquad (5)$$

Utilizing the Jacobi-Anger expansion:

$$e^{iA\cos B} = \sum_{m=-\infty}^{\infty} i^m J_m(A) e^{imB} \qquad (6)$$

for the exponential factor we obtain the following expression where $J_m$ is the Bessel function of order m:

$$S(t) = \sum_m i^m S_m(t) \qquad (7)$$

where $$S_m(t) = \int \rho'_m(z,k_x) e^{i(\gamma G_z t - m g z) z} dz \qquad (8a)$$

$$\rho'_m(z,k_x) = \int \rho(x,z) J_m(k_x x) dx \qquad (8b)$$

and $$k_x = \gamma G_x T \qquad (8c)$$

This form for the signal is interpreted as a series of spin echoes $S_m(t)$ where each individual spin echo refocuses at a time $t = mg_z/(\gamma G_z)$. An inverse Fourier transform of each echo $S_m(t)$ (Eqn 8a) allows us to extract the function $\rho'_m(z,k_x)$. Once this function is found from each $S_m(t)$, Eqn 8b is solved to obtain $\rho(x,z)$. Three ways of solving Eqn 8b are described below.

In the above equations, the effects of T1 and T2 relaxation have been ignored. There are factors which include the T1 and T2 relaxation which multiply the spin density $\rho(x,z)$ according to standard formulas. For example, the weighting of the signal from the relaxation of the transverse magnetization will result in a multiplicative factor of $\exp\{-TE/T2\}$, where TE is the time of a particular spin echo the weighting from longitudinal relaxation will include a factor similar to $\{1-\exp(-TR/T1)\}$, where TR is the repetition time of the 90 degree excitation pulses. these two multiplicative factors give a natural contrast in the signal between different soft tissues in MRI which depends on the transverse and longitudinal time constants T2 and T1 of the magnetization. they are left out of the equations here for simplicity in the mathematics. these factors will, however, affect the signal amplitude and hence the image contrast in the usual way.

There are some constraints on the various parameters which influence the signal which is obversed as a function of time S(t). First, the time at which a particular $S_m$ spin echo forms TE(m) is when the phase in Eqn 8a is zero:

$$TE(m) = m g_z/(\gamma G_z). \qquad (9)$$

spacing between successive spin echos, i.e. $\Delta m = 1$, is $$\Delta TE(\Delta m = 1) = g_z/(\gamma G_z). \qquad (10)$$

Another condition is that, if each echo $S_m(t)$ is to be separable in time, in another words to not overlap with other echos, then the spacing between successive spin echos $\Delta TE(\Delta m=1)$ should be equal to or greater than the length of time $\tau$ over which the spin echo is finite.

Figure 13:
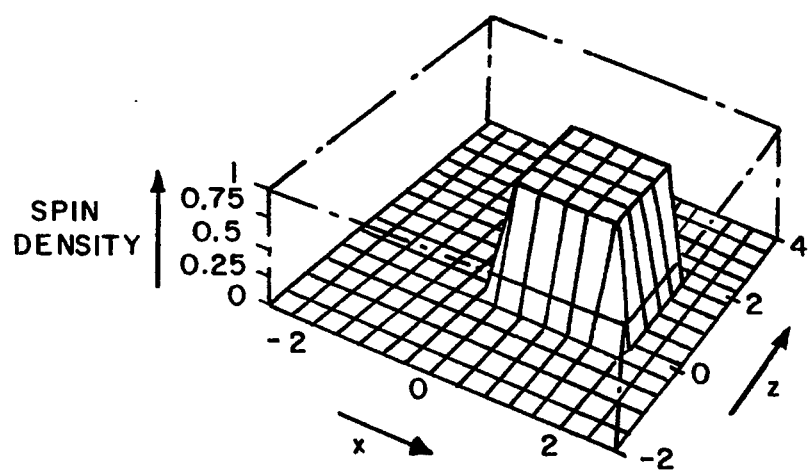
FIG. 13 illustrates a test object having a spin density of zero except for a small square region having a spin density of one.

A third condition is the Nyquist criteria, which is present in all other MRI techniques as well, and which states that the maximum frequency one can measure during the data acquisition is equal to half the data sampling rate. In the case of MRI, two measurements in quadrature are usually made for each sampling time, so that the Nyquist criteria becomes that one can measure a frequency bandwidth up to the sampling rate. This criteria can be stated in the following way:

$$\gamma G_z z_{res} \tau = 1. \qquad (11)$$

to illustrate the above. the signal S(t) is calculated for the case where the spin density $\tau(x,z)$ is zero except for a small square region as shown in FIG. 13.

Figure 14:
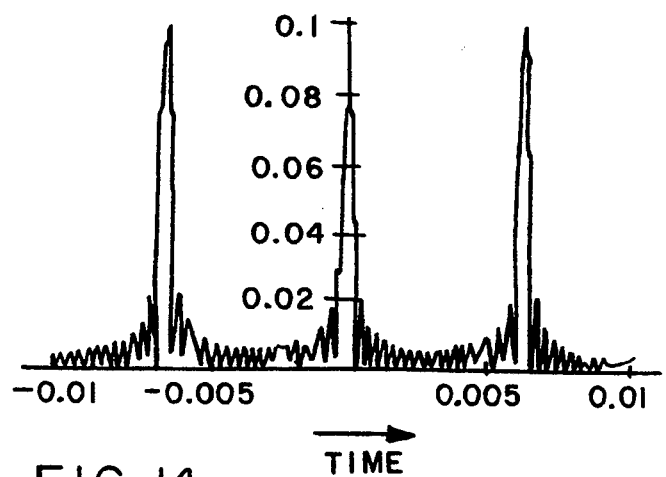
FIG. 14 illustrates the magnitude of three successive spin echoes in time of the test object of FIG. 13.

For this example, the time duration of each spin echo $S_m(t)$ is about 1 ms. Hence, for a resolution along the z axis, $z_{res} = 1$ mm, Eqn 11 requires a value of $G_z = 2.4$ G/cm when observing at hydrogen nuclei or protons where the gyromagnetic ratio $\gamma = 4257.6$ Hz/G. In order that successive m echos are separable in time, $\Delta TE(\Delta m=1) = 1$ ms. Then from Eqn 10, $g_z = 10$ cycles/cm. This value of $g_z$ determines the spatial frequency of the periodic component of the polypole field. For the simple case described above where $\rho(x,z) = 0$ everywhere except the region between 0 and 2 for both the x and z coordinates, the time signal can be calculated. Three successive m spin echos are shown in FIG. 14 as a function of time for this case. There are conditions when the echos are not separable in time and hence overlap. This case will be dealt with later. If the echos are separable, each echo is sampled in time according to the Nyquist criteria. For example, for a 128×128 image, each m echo must be sampled at the Nyquist sampling rate 128 times, and at least 128 different m echos must be sampled.

When data acquisition is completed, the first step in the reconstruction procedure is to Fourier transform each echo $S_m(t)$ (Eqn 8a). This gives us the function $\beta'_m(z,k_x)$. Once the function is found for each $S_m(t)$, a solution for Eqn 8b is needed to solve for $\rho(x,z)$. Any method that can reconstruct an image can be used in the practice of the invention. Those skilled in the art can use a variety of methods. Examples of three methods to solve Eqn 8b are based on the following:

1. Addition theorem $$\sum_{k=-\infty}^{\infty} (-1)^k J_{-\nu+k}(t) J_k(z) = J_{-\nu}(z+t) \qquad (12)$$

2. Neuman Expansion $$\rho(x,z) = \sum_{l=0}^{\infty} a_l(z) J_l(k_x x) \tag{13}$$

3. Construction of Orthogonal Functions $$\sum_m J_m(k_x x') \Delta_m(k_x x) = \delta(x - x') \tag{14}$$

{References for Eqns 12 and 13 are from Gradshteyn, I. S. and Ryzhik, I. M., *Table of Integrals, Series and Products*, Academic Press, Inc., San Diego (1980), p. 980 and 670, respectively.)

The algorithms used to solve for $\rho(x,z)$, using the Addition Theorem and the Neuman Expansion results in a solution which is an approximation of $\rho(x,z)$, which is denoted $\tilde{\rho}(x,z)$. The result of using the third relationship above gives back the spin density exactly. The existence of the orthogonal function $\Delta_m$ is not necessarily guaranteed, however, the difference between the calculated spin density $\tilde{\rho}(x,z)$ and the actual spin density $\rho(x,z)$ is given by the convolution of the actual spin density with what is known as the point spread function $h(x)$:

$$\tilde{\rho}(x',z) = \int \rho(x,z) h(x - x') dx' \tag{15}$$

Hence, for the third case above, $h(x)$ is simply a delta function $\delta(x)$. Note that the summation over m for the third case is over the number of m echos acquired. The algorithms use to construct $\tilde{\rho}(x,z)$ and which are based on the above three properties are as follows:

$$1. \quad \tilde{\rho}(x',z) = \sum_{m=-\infty}^{\infty} (-1)^m \rho'_m(z,k_x) J_m(k_x x') \tag{16}$$

$$2. \quad \tilde{\rho}(x',z) = \sum_{m=0}^{\infty} \frac{2m}{x} \rho'_m(z,k_x) J_m(k_x x') \tag{17}$$

$$3. \quad \tilde{\rho}(x',z) = \sum_{m=-\infty}^{\infty} (-1)^m \rho'_m(z,k_x) \Delta_m(k_x x') \tag{18}$$

the derivation of Eqn 16 is as follows. First we start with Eqn 8b:

$$\rho'_m(z,k_x) = \int \rho(x,z) J_m(\gamma G_x x T) dx = \int \rho(x,z) J_m(k_x x) dx. \tag{19}$$

then we multiply both sides by $(-1)^m J_m(k_x x')$ and sum over all m:

$$\sum_{m=-\infty}^{\infty} (-1)^m \rho'_m(z,k_x) J_m(k_x x') = \tag{20}$$

$$\int \rho(x,z) \sum_{m=-\infty}^{\infty} (-1)^m J_m(k_x x) J_m(k_x x') dx$$

Now, using the addition theorem, Eqn 12, with $v=0$, we have $$\sum_{m=-\infty}^{\infty} (-1)^m \rho'_m(z,k_x) J_m(k_x x') = \tag{21}$$

$$\int \rho(x,z) J_0\{k_x(x + x')\} dx = \tilde{\rho}(x',z)$$

which derives both the reconstruction algorithm Eqn 16 and the form of the point spread function for this case.

Figure 15:
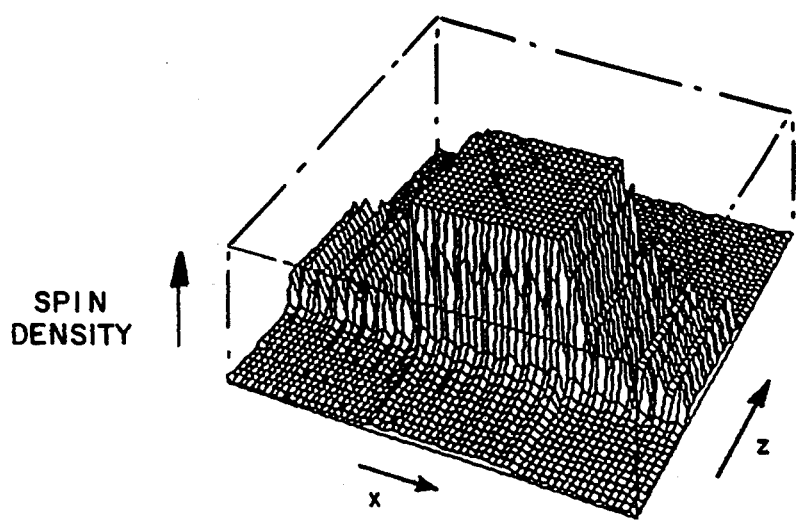
FIG. 15 illustrates an image reconstruction of the test object of FIG. 13 using the data from the spin echoes illustrated by FIG. 14

As an example, method L is used to determine $\tilde{\rho}(x,z)$ for the case described above (FIG. 13) where the spin density is zero except in the region between 0 and 2 for both x and z. The summation is approximated by only summing over the m echos acquired. In this case, we have 129 different m echos. The result of reconstruction is shown in FIG. 15. The point spread function for this case is $J_0(k_x x)$ and is the reason for the ringing in the reconstruction along the x direction.

When a resolution along z of 1 mm is desired, the spatial wavelength for the polypole coil must be less than 1 mm (i.e. $g_z$ 10 cycles/cm). That may limit the application of certain embodiments of the polypole coil. In certain embodiments, the magnetic field from the coil may not be appreciable when the distance from the surface of the coils is more than several separation lengths. The separation length is defined as The distance between neighboring elements of the polypole coil. Because neighboring elements have currents going in opposite directions, the periodicity along the z axis is simply twice the separation between each current carrying element. Another consequence of the fact that neighboring elements have oppositely directed currents is the magnetic field from neighboring elements cancels at distances away from the plane of the currents which are large compared to the separation between elements.

For the specific example used above, the separation between elements is 1 mm, hence the polypole field will be substantial over a distance of several millimeters away from the surface where the current carrying elements exist. Thus, the preferred field will penetrate into the object to be imaged about a few millimeters.

To obtain further penetration, the wavelength criteria preferably are relaxed. The wavelength should be roughly greater than or equal to the distance the object to be imaged is from the surface carrying the current for the polypole coil, thus, to image grey matter in the brain, the field should penetrate several centimeters into the brain. Modifications of the above technique allow deeper penetration of the polypole field.

One way to relax the wavelength criteria is to allow the separation between consecutive $S_m(t)$ spin echos, $\Delta TE(\Delta m=1)$ to be much less than $\tau$. This results, however, in an overlap of the different $S_m$ echos. To separate the different overlapping echos, another encoding scheme is employed. This one is similar to a phase encoding method. To achieve, this the polypole field now has a controllable phase shift $\theta_n$.

$$B = G_x x \cos(g_z z = \theta_n) \tag{22}$$

This can easily be achieved by physically constructing two polypole coils, each offset by half a wavelength, and varying the amplitude of the current driving each coil. Using a trigonometric identify, Eqn 22 becomes:

$$B = G_x x (\cos(g_z z) \cos\theta_n - \sin(g_z z) \sin\theta_n \tag{23}$$

Thus by having two polypole coils: $B_1 = G_x \cos(g_z z)$ and $B_2 = G_x \sin(g_z z)$, any phase shift can be created by varying the amplitude of the two coils by $\cos\theta_n$ and $\sin\theta_n$ respectively. The resulting signal is similar to that set forth earlier in Eqn 7 except that there is a phase factor from the polypole phase shift:

$$S(t) = \sum_m e^{im\theta_n} (i)^m S_m(t) \tag{24}$$

Hence, if there are n overlapping $S_m(t)$ echos, then one repeats the experiment n times, each with a different value of $\theta_n$ obtaining n different values of S(t). Then using a simple discrete Fourier transform, the n different spin echos can be resolved.

The use of a periodic magnetic field for MRI, in accord with this invention, can also provide new useful flow techniques, i.e., methods for obtaining velocity information from a sample, e.g., blood flow in organs, etc.

In accord with another preferred embodiment of this invention, a periodic field is provided that can be described by $$B_z(z) = A \sin(g_z z), \tag{25}$$

Figure 7:
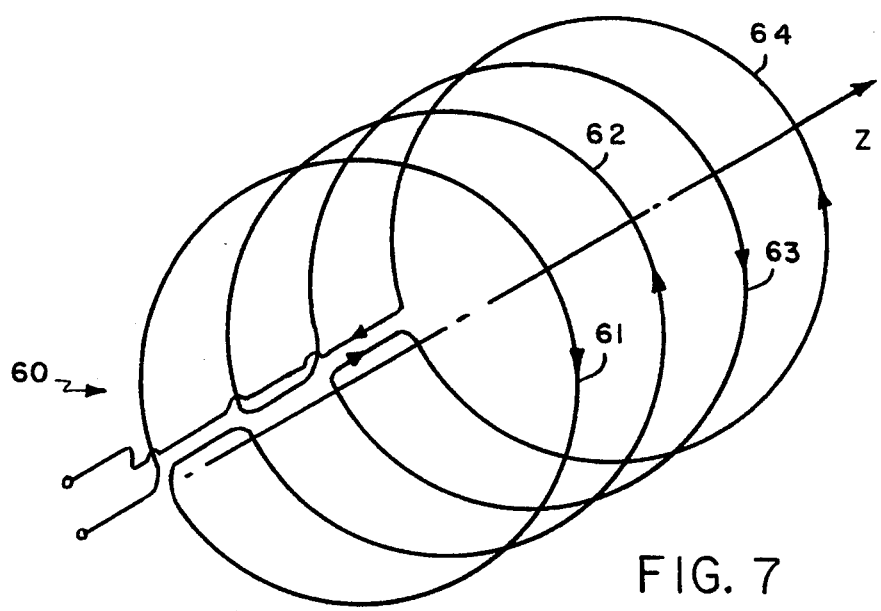
FIG. 7 illustrates another embodiment of a polypole encoding coil in accord with the present invention.

Nuclear spins moving with a constant velocity where the only nonzero component is along the z direction (i.e. $z = z_0 + v_z t$) will undergo frequency modulation:

$$\omega = \gamma G_x x \sin(g_z z_0 + g_z v_z t), \tag{26}$$

where the modulation frequency is proportional to the velocity and hence simple FM detection will give a velocity distribution. the amplitude of the modulation in Eqn 25 will depend on the x coordinate. If flow information for a particular value of x is desired, selective RF excitation can be used with the conventional linear gradient coil set to excite a yz plane at a particular value of x. In general, of course, there will also be a component of the velocity along x as well: $x = x_0 + v_x t$ which will cause the frequency to ramp. The dependence on x can be removed by use of a coil such as illustrated in FIG. 7 where the periodic field can be described by $$B_z(x,z) = G_x x \sin(g_z z) \tag{27}$$

where the amplitude A, is a constant.

In accord with another preferred embodiment of the invention, a moving wavefront is used to provide flow information. A periodic encoding field in the form of a propagation wave in the z direction, whose speed can be controlled, is provided in accord with the equation:

$$B_z(z) = \sin(k(z - vt)). \tag{28}$$

This will cause the sinusoidal variation in the field to travel at a controllable velocity v. Thus, a short dephasing and rephasing application of this field will allow only spins moving at a particular velocity to be rephased. This allows imaging of moving material within a small "velocity window." To achieve the field variation of Eqn 28, the function is expanded using a trigonometric identity:

$$B_z(z) = \sin(kz)\cos(kvt) - \cos(kz)\sin(kvt). \tag{29}$$

Thus, for two gradient coils, where one provides a sinusoidal field component and the other a cosinusoidal field component, it follows that:

$$B_{z,1} = G_{x,1} x \sin(g_z z), \tag{30a}$$

$$B_{z,2} = G_{x,2} x \cos(g_z z); \tag{30b}$$

and the current through each coil can be modulated so that $$G_{x,1} = \cos(g_z v t), \tag{31a}$$

$$G_{x,2} = \sin(g_z v t), \tag{31b}$$

The field is obtained by adding the contributions from Eqns 30a and b which, after substituting in the expressions in Eqns 31a and b, is:

$$B_z = x \sin(g_z z) \cos(g_z v t) - x \cos(g_z v t). \tag{32}$$

Except for the dependence on x, the field described by Eqn 32 is the same as the desired field dependence given in Eqn 29. Therefore, to obtain a travelling wave, spins are first excited in a plane at a particular value of x. This can easily be done by using a standard slice selective 90 degree pulse together with conventional linear gradient coils to select a plane centered at a chosen value of x, in a manner well-known by those skilled in the art. The x dependency can be eliminated using a cosine and sine field with a constant amplitude similar to that described in Eqn 27.

Figure 4A:
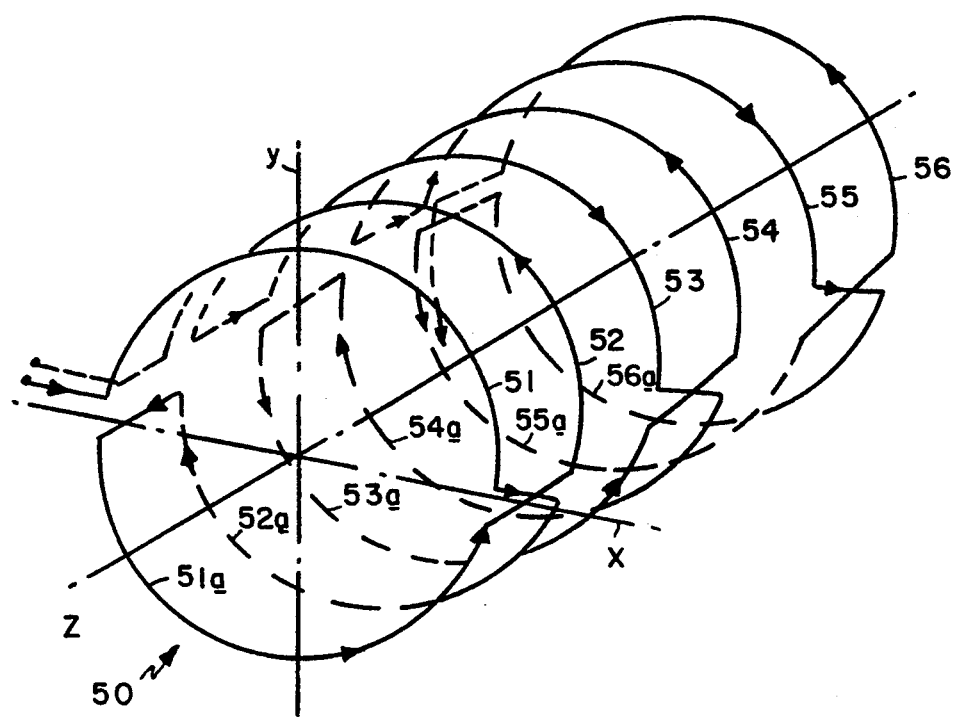
FIG. 4A illustrates one embodiment of a polypole encoding coil accord with the present invention.

One preferred embodiment of an apparatus for providing a multidimensional encoding magnetic field is a coil of the type illustrated in FIG. 4A. The coil, which may be called a polypole coil, comprises a series of parallel conductive wires, equally spaced apart, forming a cylindrical shape. The wire conductors on the first half of the surface of the cylinder are arranged in planes perpendicular to the longitudinal axis, or z-axis, of the cylinder so that the electrical current flows in one direction, say clockwise, in the odd numbered conductors 51, 53, 55 and in the opposite direction, i.e. counterclockwise, in the even numbered conductors 52, 54, 56. On the second half of the cylinder surface is a symmetrical arrangement of conductors wherein the electrical current in each conductor flows opposite to the direction of the current in the conductor in the same plane on the first half of the cylinder. For example, conductor 51 on the first half of the cylinder surface has current flowing clockwise. Conductor 51a, in the same plane as conductor 51 but on the second half of the cylinder surface, has electrical current flowing counterclockwise. See FIG. 5A wherein the direction of current in the conductors is illustrated by the arrowheads. Likewise, conductor 52 has counterclockwise current whereas conductor 52a has clockwise current. A plurality of conductors can be laid down coincidently to increase the magnitude of the magnetic field.

Figure 4C:
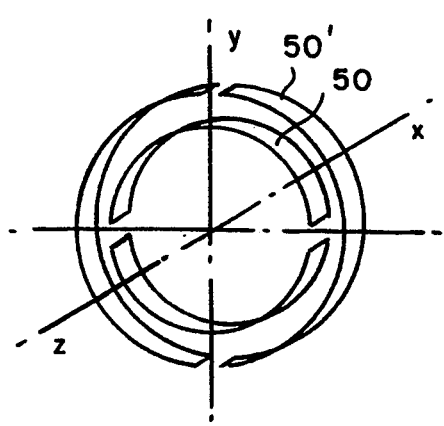
FIG. 4C illustrates two coils having the configuration of the coli of FIG. 4A, one coil disposed within the other and rotated 90 degrees with respect to it.
Figure 4B:
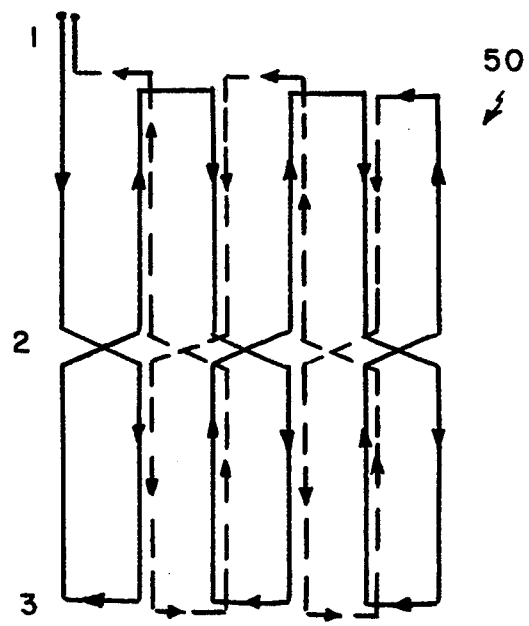
FIG. 4B illustrates in a planar view the wiring configuration of the coil of FIG. 4A

FIG. 4B illustrates a schematic for a planar layout of conductor wire for making the coil 50 of FIG. 4A. A plurality of turns can be laid down in the same scheme to provide the desired field strength. The conductor layout is formed into a cylinder to make the polypole coil 50.

Figure 5:
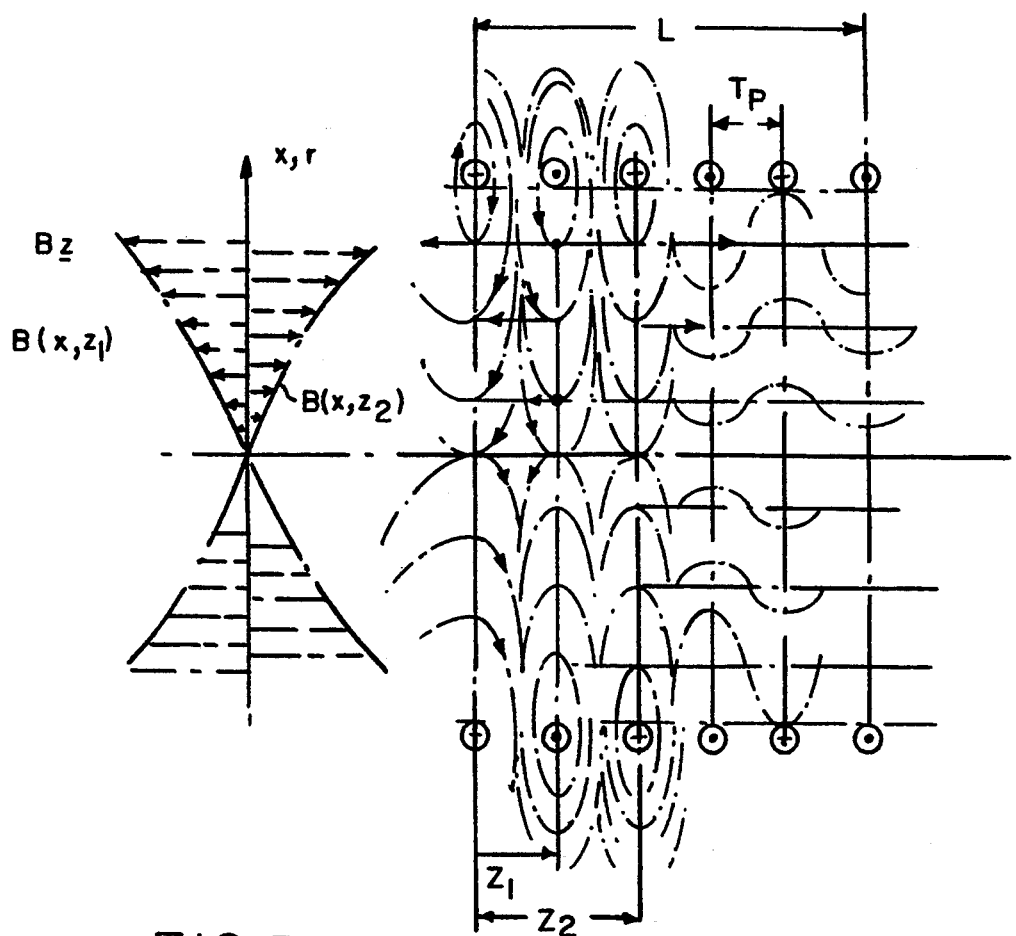
FIG. 5 is a schematic illustrating the magnetic field generated by the coil of FIG. 4A.

FIG. 5 is a schematic illustration of the magnetic field from the polypole coil 50 by looking at a cross-section of a plane through the coil parallel to the longitudinal z-axis and through both halves of the cylinder surface, i.e. perpendicular to the x-axis and parallel to the y, z plane. the polypole coil 50 provides a field having a periodic component in the z-direction with the amplitude of the period changing substantially linearly in the y-direction.

In a preferred embodiment of an MRI system in accord with the present invention, two such polypole coils are used to provide x and y gradient coils having transverse multidimensional dependence fields in each of the x, z and y, z directions, respectively. As illustrated in FIG. 4C, coil 50 is concentric with coil 50' and coil 50' is rotated 90° to provide a transverse field in the x-direction.

the frequency and period of the field provided by the polypole coil 50 is dependent upon the spacing of the conductors. The spacing should not be so close that the fields from adjacent conductors cancel each other and, conversely, should not be so large that the field gradient is essentially nonperiodic over the imaging volume. Typically, the spacing is determined by image resolution desired.

In another preferred embodiment of the invention, a second type of polypole coil as illustrated in FIG. 7 provides a periodic magnetic field component in the z-direction, i.e. along the axis of the coil but provides no amplitude gradient transverse to the z-axis. The z-polypole coil 60 comprises a series of parallel circular loops of conductor, each loop contained in a plane perpendicular to the z-axis, and equally spaced apart. The electrical current in the odd numbered loops 61, 63 flows in one direction, say clockwise, and the current in the even numbered loops 62, 64 flows in the opposite direction, i.e. counterclockwise.

Again, a plurality of conductors can be used to form each circular loop of polypole coil 60 to provide a predetermined magnetic field strength.

Figure 8:
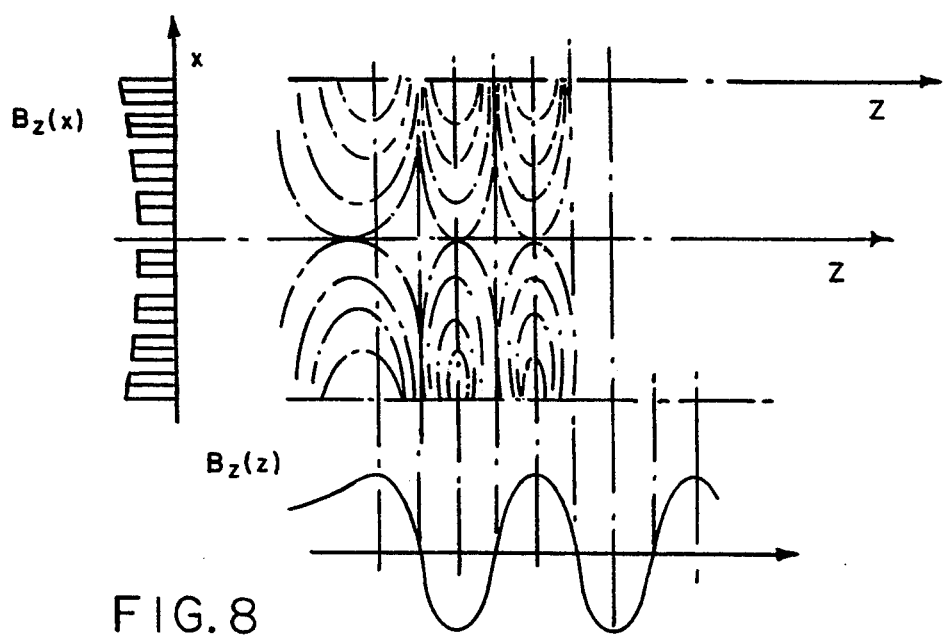
FIG. 8 is a schematic of the magnetic field generated by the coil of FIG. 7.

A schematic illustration of the magnetic field provided by coil 60 is shown in FIG. 8. As can be seen, the field is periodic in the z-direction. The frequency and period can be varied by the spacing of the loops as with the transverse polypole coil 50 of FIG. 4A. Preferably, the loops of the z-polypole coil are spaced sufficiently so that the fields do not cancel but not too far that the field is essentially nonperiodic over the volume of interest. the spacing of loops of the z-polypole coil is also determined by the resolution desired.

Figure 6:
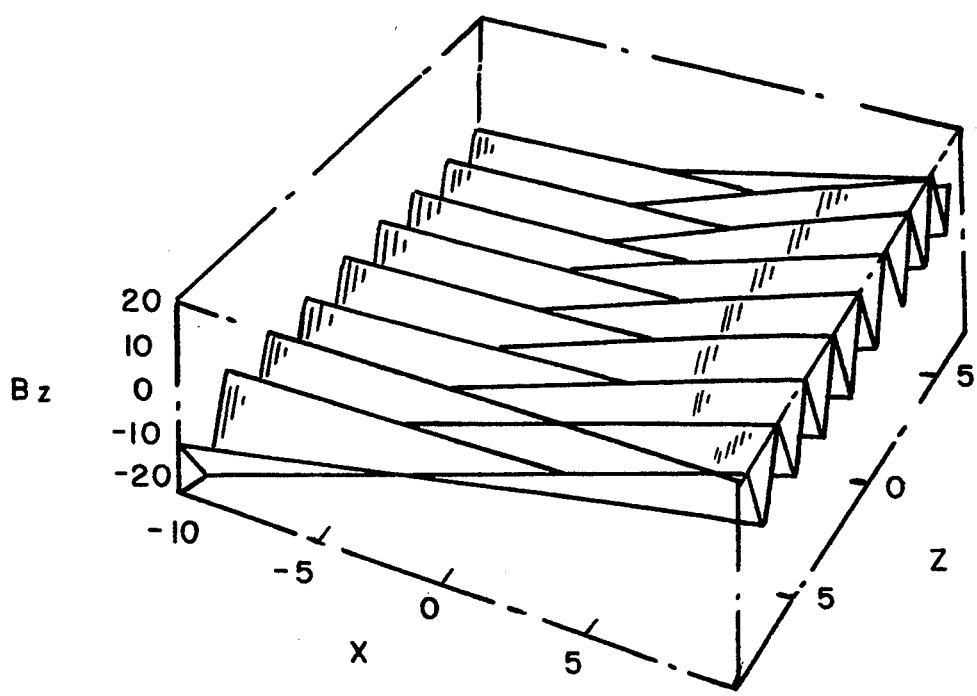
FIG. 6 illustrates the dependence of the field of a coil of along the longitudinal axis of the coil (z) and perpendicular to the coil axis (x).

An example of a preferred embodiment of an encoding field in accord with the present invention is illustrated in FIG. 6.

the polypole field can be generated in several different geometries, e.g., cylindrical (FIGS. 4A and 7), rectangular (FIG. 10), planar (FIG. 11), etc.

Figure 12A:
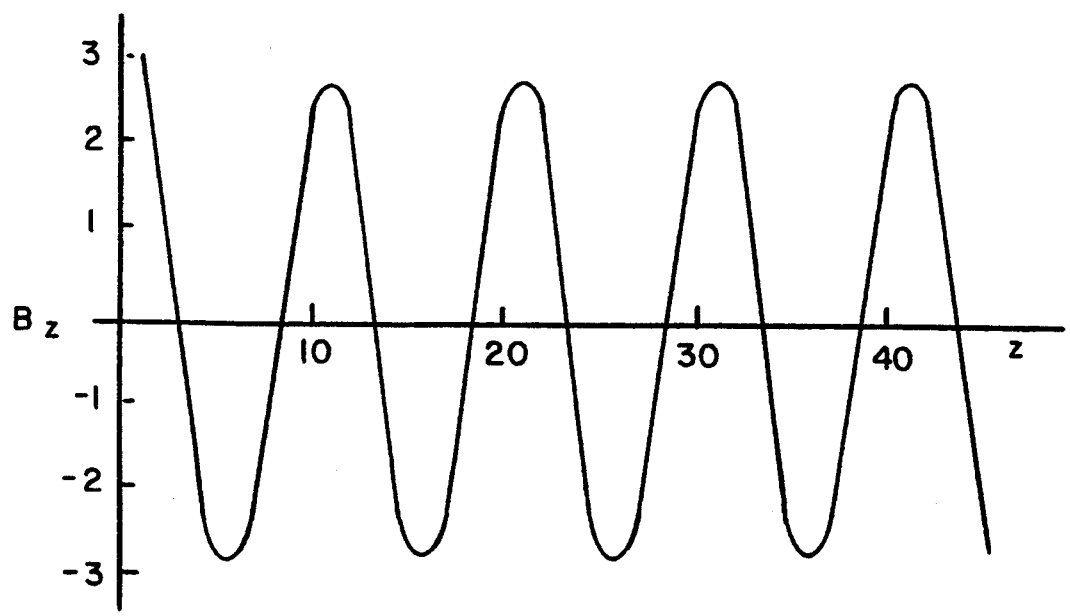
FIG. 12A illustrates the magnetic field as a function of z produced by the coil of FIG. 10.
Figure 12B:
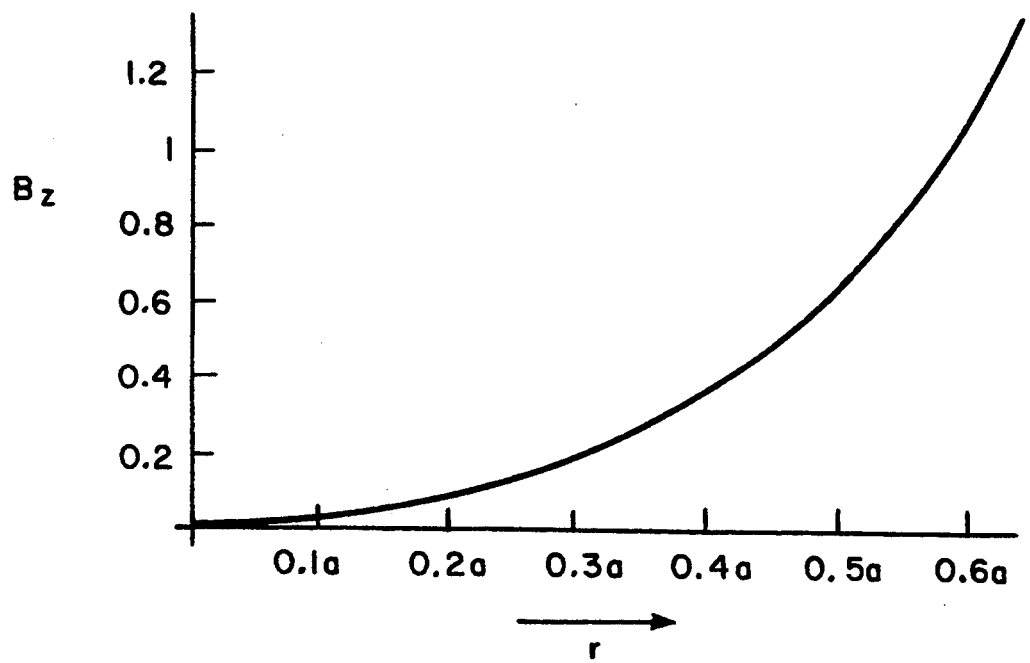
FIG. 12B illustrates the value of the magnetic field as a function of The radius r for $\theta = 45°$ where r and $\theta$ are cylindrical coordinates inside the coil of FIG. 10.

The field dependence for the magnetic field produced by a polypole coil using rectangular geometry (FIG. 10) is illustrated by the graphs in FIGS. 12A and 12B. FIG. 12A shows the value of $B_z$ as a function of z at a line drawn along x=0.2a, y=0.2a where the spacing between the coils is a and the x and y dimensions of the coil are 2a, i.e. the perpendicular distance between the current paths is 2a. The sinusoidal dependence of the field as a function of z is shown.

Figure 11:
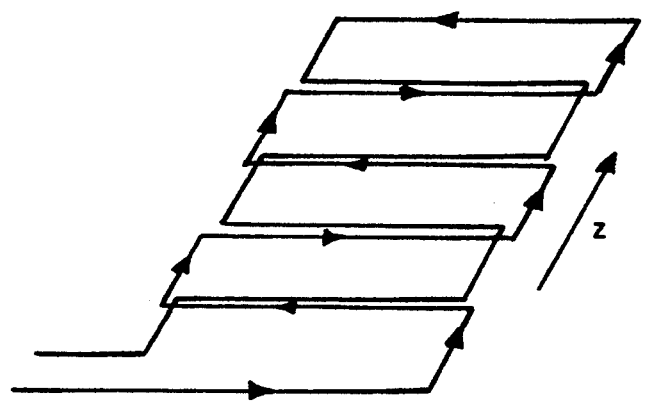
FIG. 11 illustrates an embodiment of a polypole coil system in accord with the present invention having a planar configuration.

FIG. 12B shows the value of $B_z$ as a function of cylindrical coordinates r, $\theta$ where r is a variable and $\theta=45°$, i.e. along a diagonal of a square formed by plane intersecting the coil perpendicular to the z axis (see FIG, 10). It can be seen that the field is not linear. Therefore, the field of view is typically restricted to portions of the radius where the field is substantially linear, e.g., where r is between −0.3a and +0.3a at 45°.

the polypole field provided by the planar geometry system illustrated in FIG. 11 can be oriented in any direction to provide a periodic magnetic field component perpendicular to the length of the parallel conductors, i.e. the z-direction as shown in FIG. 11. Two planar arrays of conductors arranged parallel to each other with conductors in a plane perpendicular to the direction of the periodic field can be used instead of the coils of FIG. 4A or FIG. 7. The particular field generated, FIG. 5 or FIG. 8, will depend upon the current direction in opposing conductors in the same plane.

Figure 10:
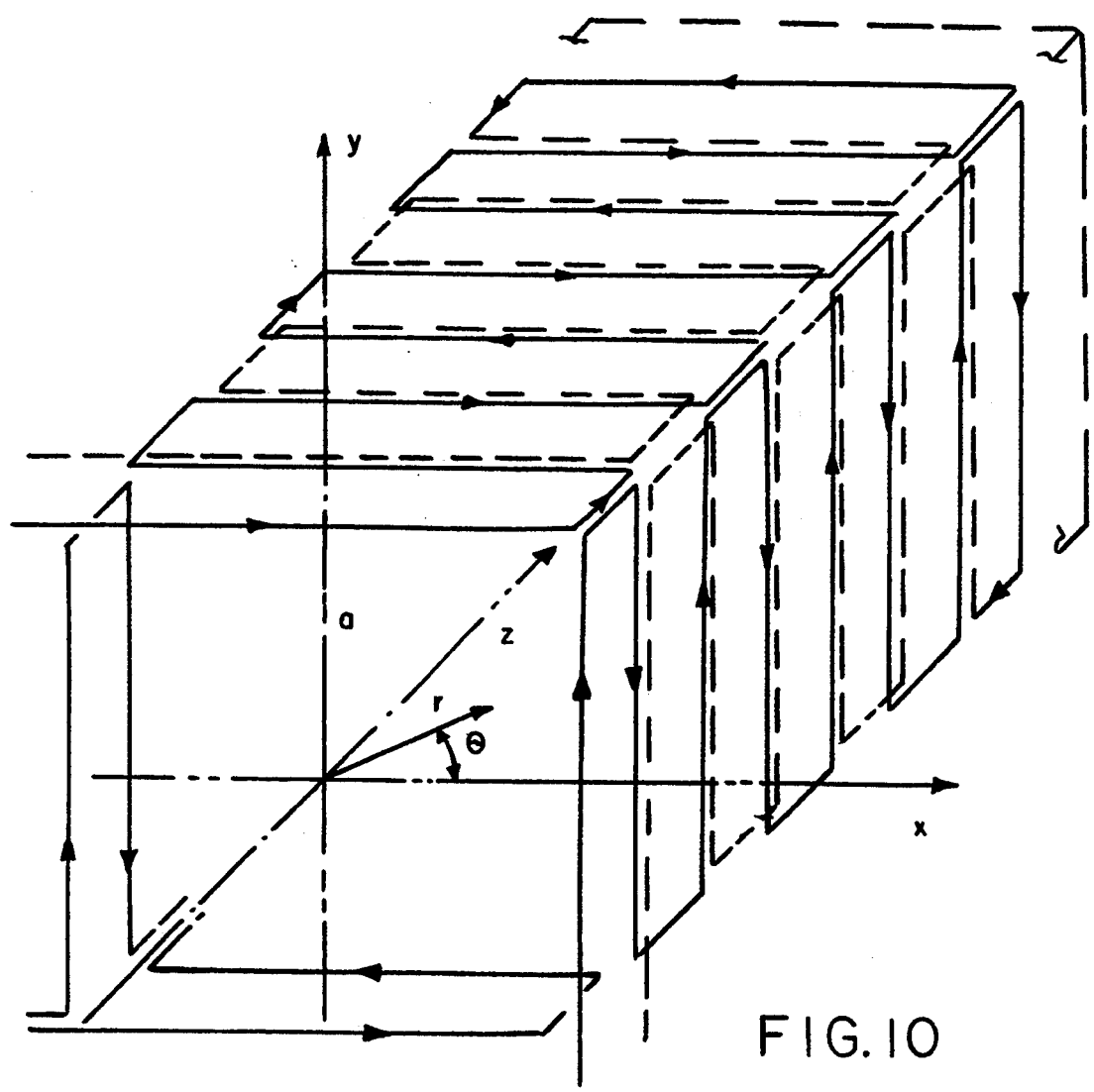
FIG. 10 illustrates an embodiment of a polypole coil system in accord with The present invention having a "rectangular" configuration.

Four such planar coils can be assembled to form the "rectangular" coil illustrated in FIG. 10.

The invention has been described in detail with reference to preferred embodiments thereof. However, it is realized that those skilled in the art, upon consideration of the specification and drawings disclosed herein, may make modifications and improvements within the spirit and scope of the claims.

We claim:

1. Apparatus for obtaining image formation information from an object, said apparatus comprising:
   a magnet system for applying a magnetic field that is substantially homogeneous over an imaging space in which at least a portion of the object to be imaged is placed;
   an excitation system for applying radio frequency excitation to the object in the imaging space;
   a receiver system for detecting NMR signals from the object; and
   a magnetic field encoding system to apply an encoding magnetic field in the imaging space to provide spatial discrimination of the NMR signals from the object;
   wherein the encoding magnetic field comprises a field, the strength of which varies depending on more than one orthogonal spatial coordinate.

2. The apparatus of claim 1, wherein the strength of the encoding magnetic field depends on two orthogonal spatial variables.

3. The apparatus of claim 2, wherein the strength of the encoding magnetic field varies in a periodic manner with respect to one of the orthogonal spatial variables.

4. The apparatus of claim 1, wherein the magnetic field encoding system further comprises a linear field gradient wherein the strength of the field varies with respect to one spatial variable.

5. The apparatus of claim 1, further comprising a recording device for recording the NMR signal information detected by the receiver system.

6. The apparatus of claim 5, further comprising an image reconstruction system that transforms the recorded information into a reconstructed image.

7. The apparatus of claim 1, wherein the excitation system and the receiver system comprise the same radio frequency coil.

8. The apparatus of claim 1, wherein the magnetic field encoding system comprises a polypole coil, said coil comprising a plurality of pairs of electrical current carriers aligned in a first spatial direction wherein the current flow in the carriers is orthogonal to the first spatial direction and wherein the carriers are arranged such that the first carrier of each pair has electrical current flowing in one direction and the second carrier in each pair has electrical current flowing in the opposite direction.

9. The apparatus of claim 8, wherein the current carriers are substantially equally spaced from each other along the first spatial direction.

10. The apparatus of claim 8, wherein the current carriers are arranged arcuately in a cylindrical configuration where the axis of the cylinder is parallel to the first spatial direction.

11. Apparatus for obtaining image formation information from an object, said apparatus comprising:

a magnet system for applying a magnetic field that is substantially homogeneous over an imaging space in which at least a portion of the object to be imaged is placed;

an excitation system for applying radio frequency excitation to the object in the imaging space;

a receiver system for detecting NMR signals from the object; and a magnetic field encoding system to apply an encoding magnetic field in the imaging space to provide spatial discrimination of the NMR signals from the object;

wherein the encoding magnetic field comprises a field, the strength of which varies in a periodic manner with respect to one spatial direction.

12. The apparatus of claim 11, wherein the strength of the encoding magnetic field further varies substantially linearly with respect to a spatial direction orthogonal to the direction of periodicity.

13. A method for obtaining MRI images, said method comprising:

subjecting at least a portion of an object in an imaging space to a substantially homogeneous magnetic field;

applying in a controlled time sequence a radio frequency field and an encoding magnetic field to spatially encode NMR signals;

detecting the spatially encoded NMR signals; and reconstructing an image of at least a portion of the object in the imaging space based on the information in the spatially encoded NMR signals;

wherein the method further comprises providing a encoding magnetic field, the strength of which varies with more than one orthogonal spatial coordinate.

14. The method of claim 13, wherein the step of providing an encoding magnetic field further comprises providing a second field that has a linear gradient.

15. The method of claim 13, further comprising recording spatially encoded NMR signals.

16. The method of claim 13, wherein the step of providing an encoding magnetic field comprises providing a field component, the strength of which varies wit respect to two orthogonal spatial variables.

17. The method of claim 16, wherein the step of providing an encoding magnetic field comprises providing a field component, the strength of which varies in a periodic manner with respect to one of the orthogonal spatial variables.

18. A method for obtaining MRI images, said method comprising:

subjecting at least a portion of an object in an imaging space to a substantially homogeneous magnetic field;

applying in a controlled time sequence a radio frequency field and an encoding magnetic field to spatially encode NMR signals;

detecting the spatially encoded NMR signals; and reconstructing an image of at least a portion of the object in the imaging space based on the information in the spatially encoded NMR signals;

wherein the method further comprises providing a encoding magnetic field, the strength of which varies in a periodic manner with respect to one spatial direction.

19. The method of claim 18, wherein the step of providing an encoding magnetic field further comprises providing a field, the strength of which varies substantially linearly with respect to a spatial direction orthogonal to the periodicity.

20. A method for obtaining two-dimensional MRI image information in one signal acquisition interval without switching the encoding field, said method comprising:

providing an MRI imaging system having an encoding magnetic field, the strength of which varies in more than one orthogonal spatial direction, thereby spatially encoding NMR signals in two dimensions during one signal acquisition interval and collecting two dimensional information in one such interval without switching.

21. The method of claim 20, further comprising providing an encoding magnetic field, the strength of which varies with respect to two orthogonal spatial variables.

22. The method of claim 21, further comprising providing an encoding magnetic field, the strength of which varies in a periodic manner with respect to one of the orthogonal spatial variables.

23. The method of claim 22, further comprising providing two polypole coils which are ninety degrees out of phase and varying the current ratio through the two coils to vary the phase of the periodic field.

24. The method of claim 23, further comprising collecting NMR signal information for one phase of the periodic field, changing the phase of the periodic field and again collecting NMR signal information, repeating previous step of collecting NMR signal information at changed phases of the periodic field to obtain a preselected number of NMR signal information sets.

25. A method for obtaining MRI image information from an object, said method comprising obtaining two dimensional information in one signal acquisition interval (a) by placing the object in a substantially homogeneous magnetic field ($B_o$) and (b) by subjecting the object to an encoding magnetic field (1) having a first encoding field component that varies periodically in a first spatial direction and varies substantially linearly in a second spatial direction orthogonal to the first spatial direction and (2) having a second encoding field component that varies substantially linearly in the first spatial direction, thereby spatially encoding nuclear spins in two dimensions, and collecting the two dimensional information in one signal acquisition interval.

26. The method for obtaining MRI image information from an object as set forth in claim 25, wherein the first spatial direction is parallel to the axis of symmetry of the substantially homogeneous magnetic field ($B_o$).

* * * * *